(12) United States Patent
Lien et al.

(10) Patent No.: US 7,786,782 B2
(45) Date of Patent: Aug. 31, 2010

(54) METHOD AND APPARATUS FOR COUNTER-BASED CLOCK SIGNAL ADAPTATION

(75) Inventors: Scott Te-Sheng Lien, Palo Alto, CA (US); Mark Men Bon Ng, Milpitas, CA (US); Jesse H. Jenkins, IV, Danville, CA (US)

(73) Assignee: Xilinx, Inc., San Jose, CA (US)

( * ) Notice: Subject to any disclaimer, the term of this patent is extended or adjusted under 35 U.S.C. 154(b) by 51 days.

(21) Appl. No.: 12/240,645

(22) Filed: Sep. 29, 2008

(65) Prior Publication Data
US 2010/0079182 A1    Apr. 1, 2010

(51) Int. Cl.
*H03K 3/017* (2006.01)
(52) U.S. Cl. .................. 327/175; 327/172; 327/291; 327/298; 327/35
(58) Field of Classification Search ............. 377/47–49; 327/31, 35, 36, 113–117, 119, 231–233, 327/235, 236, 291, 292, 294, 298, 299, 172–176
See application file for complete search history.

(56) References Cited

U.S. PATENT DOCUMENTS

| | | | |
|---|---|---|---|
| 6,107,846 A * | 8/2000 | Shinmori | 327/116 |
| 6,788,120 B1 | 9/2004 | Nguyen | |
| 6,924,684 B1 | 8/2005 | Nguyen | |
| 7,005,900 B1 * | 2/2006 | Nguyen | 327/122 |
| 7,236,557 B1 | 6/2007 | Nguyen | |

OTHER PUBLICATIONS

Agilent Technologies, "Fundamentals of the Electronic Counters," Application Note 200, Mar. 1997, 68 pp., available from Agilent Technologies, 5301 Stevens Creek Boulevard, Santa Clara, California 95051, USA.
Agilent Technologies, "Fundamentals of Time Interval Measurement," Application Note 200-3, Jun. 1997, 68 pp., available from Agilent Technologies, 5301 Stevens Creek Boulevard, Santa Clara, California 95051, USA.

* cited by examiner

*Primary Examiner*—An T Luu
(74) *Attorney, Agent, or Firm*—Michael T. Wallace; John J. King

(57) ABSTRACT

A method and apparatus to implement clock signal adaptation is provided to characterize an input clock signal that is to be adapted and in response, generate adaptation updates at each subsequent clock cycle of the input clock signal. In a first embodiment, clock signal adaptation occurs through duty cycle correction (DCC) to substantially achieve a 50% duty cycle. In an alternate embodiment, clock signal adaptation occurs through a multiplication operation that is applied to the clock signal to be adapted, whereby the multiplication operation is parameterizable to allow odd/even multiplication. In an alternate embodiment, clock signal adaptation occurs through a phase-shift operation that is applied to the clock signal to be adapted, whereby the phase-shift operation is parameterizable to allow all possible fractions and percentages of phase shifts.

20 Claims, 7 Drawing Sheets

METHOD AND APPARATUS FOR COUNTER-BASED CLOCK SIGNAL ADAPTATION

FIELD OF THE INVENTION

The present invention generally relates to clock signal adaptation, and more particularly to counter-based clock signal adaptation.

BACKGROUND OF THE INVENTION

Synchronous digital design techniques are focused upon the definition of a stable clock reference signal that is used as a time-based reference with which data is propagated throughout a digital system. A clock distribution network is often utilized to distribute the stable clock reference signal from a common reference point, so that clock signal characteristics, such as clock skew and phase jitter, may be well understood and controlled.

Ideally, every logic change in each storage element of a synchronous digital design occurs simultaneously with the rising edge and/or falling edge of the clock signal. Storage elements, such as flip-flops and registers, are utilized to enforce the synchronous operation of the design, which also includes combinatorial logic. Depending upon the delay introduced by the combinatorial logic and other factors, hold-time and setup-time violations may be experienced. Thus, accurately controlling the timing at which each rising edge and/or falling edge of the clock signal occurs at each storage element is critical to the design's performance.

As such, synchronous circuit designers often design circuits that receive a reference clock signal, which then performs adaptation operations on the reference clock signal depending upon the needs of the particular clock domain of interest. In many instances, such clock signal adaptation includes clock division circuitry to reduce the frequency of the reference clock signal in the clock domain. Other clock signal adaptation operations include duty cycle correction, phase alignment, clock signal multiplication, and clock signal phase adjustments.

Clock signal adaptation circuits often include the use of phase-locked loops (PLLs), for example, to extract a 50% duty cycle clock signal from a pulse waveform. Similarly, phase alignment, clock signal multiplication, and clock signal phase adjustments may also be implemented through the use of a PLL. PLL design, however, relies substantially on analog design practices, which may increase simulation time and complexity. Furthermore, a PLL design that functions properly using a first integrated circuit (IC) topology may cease functioning properly when utilized with a second IC topology due to manufacturing process variations between the IC topologies.

Digital delay lock loops (DLLs) may also be utilized to perform similar clock signal adaptation functions, such as duty cycle correction and clock signal phase shifting. DLL circuit designs, however, are typically large and generally cannot be used in applications where the frequency of the input clock reference signal is unknown. Thus, duty cycle correction and phase shifting of the input clock reference signal may be impractical or even impossible using conventional circuit designs and methods.

Counter-based circuits, therefore, such as described in U.S. Pat. No. 6,788,120 issued on Sep. 7, 2004, to Nguyen (hereinafter "Nguyen '120") may be utilized to provide duty cycle correction (DCC) on an incoming clock signal. The implementation described in Nguyen '120, however, requires two clock cycles to achieve DCC and, therefore, is unable to update DCC on each clock cycle of the incoming clock signal. Furthermore, the implementation described in Nguyen '120 does not maximize efficiency of logic usage, which increases the complexity of the design and increases power and semiconductor die area usage.

Similar counter-based circuits are described in U.S. Pat. No. 6,924,684 issued on Aug. 2, 2005, to Nguyen (hereinafter "Nguyen '684") and U.S. Pat. No. 7,236,557 issued on Jun. 26, 2007, to Nguyen (hereinafter "Nguyen '557") to implement phase-shifting and multiplication, respectively, of an incoming clock signal. The phase-shifter as described in Nguyen '684, however, is limited to phase shift multiples of ½ and requires a separate input signal to determine shift value. In addition, the implementation described in Nguyen '684 requires two clock cycles to achieve the required phase shift value and, therefore, is unable to update the requisite phase value on each clock cycle of the incoming clock signal. Furthermore, the implementation described in Nguyen '684 does not maximize efficiency of logic usage, which increases the complexity of the design and increases power and semiconductor die area usage.

The multiplier as described in Nguyen '557 exhibits similar limitations. For example, only certain even integers of multiplication, e.g., 2, 4, 8, 16 etc., are possible. In addition, the implementation described in Nguyen '557 requires two clock cycles to achieve the required multiplier value and, therefore, is unable to update the requisite multiplier value on each clock cycle of the incoming clock signal. Furthermore, the implementation described in Nguyen '557 does not maximize efficiency of logic usage, which increases the complexity of the design and increases power and semiconductor die area usage.

Efforts continue, therefore, to provide clock signal adaptation circuits that are based neither on PLL methodologies nor DLL methodologies and that improve conventional counter-based circuitry to achieve decreased complexity, increased versatility, decreased power consumption, and faster adaptation.

SUMMARY OF THE INVENTION

To overcome limitations in the prior art, and to overcome other limitations that will become apparent upon reading and understanding the present specification, various embodiments of the present invention disclose a method and apparatus for counter-based clock signal adaptation.

In accordance with one embodiment of the invention, a method of implementing counter-based signal adaptation comprises generating an oscillator signal, characterizing an input signal by counting a number of cycles of the oscillator signal that exist within a first period of the input signal, and adapting the input signal during a second period of the input signal in response to the number of cycles counted to provide an output signal. The second period of the input signal is the next period after the first period of the input signal.

In accordance with another embodiment of the invention, a signal adaptation circuit comprises an edge detector that is coupled to receive an input signal and is adapted to assert a start signal in response to detecting logic transitions of the input signal. The start signal assertions are indicative of the beginning of each cycle of the input signal. The signal adaptation circuit further comprises a counter circuit that is coupled to receive an oscillator signal and the start signal, the counter circuit being adapted to provide a count signal that is indicative of a number of cycles of the oscillator signal contained within a first period of the input signal. The signal adaptation circuit further comprises an adaptation circuit that is coupled to the counter circuit and is adapted to generate an output signal during the next period after the first period of the input signal. Characteristics of the output signal are adapted in response to the number of cycles of the oscillator signal contained within a first period of the input signal.

In accordance with another embodiment of the invention, a method of adapting an input signal comprises characterizing the input signal during a first period of the input signal, determining an adaptation mode to be applied by an adaptation circuit, and applying the determined adaptation in response to the characterization to produce an output signal. The determined adaptation being applied during a second period of the input signal, where the second period is the next period after the first period.

BRIEF DESCRIPTION OF THE DRAWINGS

Various aspects and advantages of the invention will become apparent upon review of the following detailed description and upon reference to the drawings in which.

DETAILED DESCRIPTION

Generally, various embodiments of the present invention are applied to methods and associated apparatus to implement clock signal adaptation. In a first embodiment, clock signal adaptation occurs through duty cycle correction (DCC) using an apparatus that requires approximately half of the logic of conventional hardware designs. In addition, circuitry is provided that characterizes the clock signal to be adapted and in response, generates the DCC to facilitate DCC updates at each clock cycle of the clock signal that is to be adapted.

In an alternate embodiment, clock signal adaptation occurs through a multiplication operation that is applied to the clock signal to be adapted, whereby the multiplication operation is parameterizable to allow odd/even multiplication. In addition, the multiplication operation is applied within a single clock cycle of the clock signal to be adapted, which promotes multiplication adaptation on each clock cycle.

In yet another embodiment, clock signal adaptation occurs through a phase-shift operation that is applied to the clock signal to be adapted, whereby the phase-shift operation is parameterizable to allow all possible fractions and percentages of phase shifts. In addition, the phase-shift operation is applied within a single clock cycle of the clock signal to be adapted, which promotes phase-shift adaptation on each clock cycle.

Figure 1:
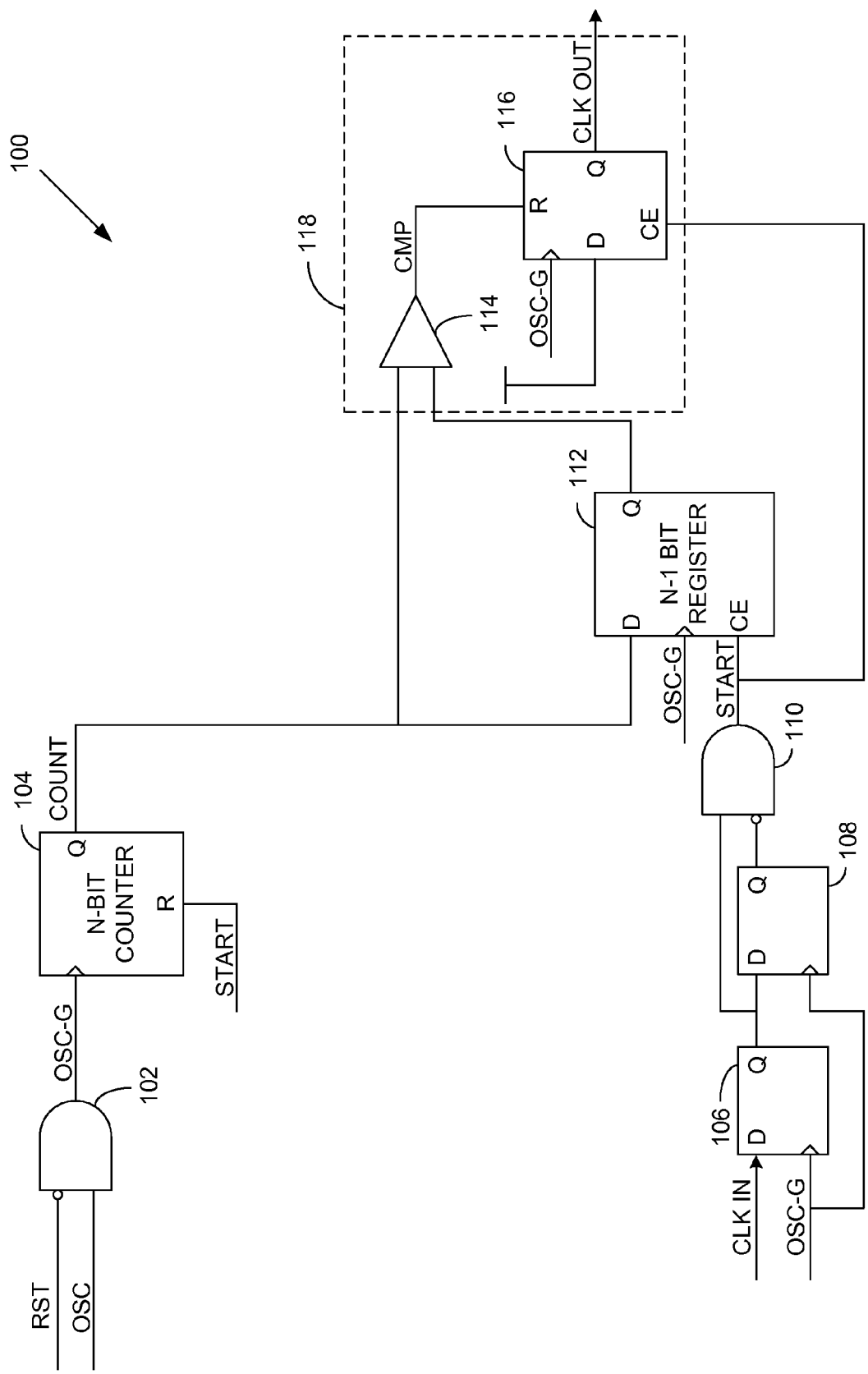
FIG. 1 illustrates a schematic diagram of a duty cycle correction (DCC) circuit in accordance with an embodiment of the present invention.

Turning to FIG. 1, a schematic diagram of clock signal adaptation circuit 100 is exemplified, whereby in accordance with one embodiment of the present invention, input clock signal characterization occurs during a first cycle of an input clock signal and clock signal adaptation, e.g., duty cycle correction, of the input clock signal occurs during a subsequent cycle of the input clock signal. Thus, duty cycle correction occurs for each cycle of the input clock signal based upon input clock signal characterization occurring during the immediately preceding input clock cycle.

In particular, signal CLK IN is a pulse waveform that may exhibit a wide variation in duty cycle. That is to say, in other words, that the amount of time that signal CLK IN is at a logic high level relative to a single period of signal CLK IN may exhibit wide variation. Thus, clock signal adaptation circuit 100 is implemented to adapt signal CLK IN to substantially achieve a 50% duty cycle.

The clock signal to be adapted, CLK IN, is received by DCC circuit 100 at the input of cascaded flip-flops 106 and 108. The output of flip-flop 108 is coupled to the inverting input of AND gate 110, while the output of flip-flop 106 is coupled to the non-inverting input of AND gate 110 and the D input of flip-flop 108. The output of AND gate 110 provides signal, START, which is the clock enable signal, CE, to N−1 bit register 112 and flip-flop 116, as well as the reset signal to N-bit counter 104.

A free-running oscillator signal, OSC, is received by the non-inverting input of AND gate 102, while a reset signal, RST, is received by the inverting input of AND gate 102. The output of AND gate 102 provides a gated oscillator signal, OSC-G, to the clock input of N-bit counter 104, while the reset input of N-bit counter 104 receives signal START. Gated oscillator signal OSC-G is also provided to the clock inputs of flip-flops 106, 108, 116 and N−1 bit register 112. The output of N-bit counter 104 is provided to a first input of comparator 114 as well as to the input of N−1 bit register 112. A second input of comparator 114 is coupled to the output of N−1 bit register 112, while the output of comparator 114 is coupled to the reset input of flip-flop 116.

In operation, the free-running oscillator signal, OSC, operates at a frequency that is substantially higher than the frequency of the signal that is to be adapted, i.e., CLK IN. Signal OSC may be generated by virtually any oscillating device, such as a ring oscillator, which may be readily instantiated within an integrated circuit, such as a programmable logic device (PLD). The relative frequency difference between signals OSC and CLK IN is a design choice, which is selected in part by the amount of resolution that is desired to be implemented by DCC correction circuit 100.

For example, if a fine resolution DCC is desired, then the relative frequency difference between signal OSC and signal CLK IN is great. If a coarse resolution DCC is desired, on the other hand, then the relative frequency difference between signal OSC and signal CLK IN may be reduced. As exemplified in FIG. 2, signal OSC (not shown) operates at a frequency that is approximately 16 times the frequency of signal CLK IN, since N-bit counter 104 is exemplified as obtaining a count of 16 (binary count from $0000_b$ to $1111_b$) during a single period of signal CLK IN. It is appreciated, however, that virtually any frequency ratio may be accommodated between signals CLK IN and OSC.

AND gate 102 generates the gated oscillator signal, OSC-G, which is gated by reset signal, RST. In particular, if signal RST is at a logic high level, then signal OSC-G is gated to a static logic low level. If signal RST is at a logic low level, on the other hand, then signal OSC is allowed to propagate through AND gate 102 to provide the gated clocking signal, OSC-G, throughout DCC circuit 100 as illustrated in FIG. 1. Once signal RST is deasserted to a logic low level and signal OSC-G is allowed to propagate, N-bit counter 104 counts the number of rising-edge, or falling-edge, occurrences of signal OSC-G. As exemplified in FIG. 2, it is noted that rising-edge occurrences of signal OSC-G are counted by N-bit counter 104.

It is further noted that N-bit counter 104 is reset for each rising-edge occurrence of signal START, which causes the count value of N-bit counter 104 to reset to zero once signal START is asserted. In the exemplary embodiment of FIG. 2, for example, N-bit counter 104 repeats the output count value, COUNT, from $0000_b$ (decimal 0) to $1111_b$ (decimal 15) and every binary combination in between since signal OSC (not shown) operates at a frequency that is approximately 16 times the frequency of signal CLK IN.

Assuming that the Q outputs of flip-flops 106 and 108 are initialized to a logic low value, flip-flops 106,108 and AND gate 110 interoperate as a rising edge detector. In particular, a rising edge of signal CLK IN sets the Q output of flip-flop 106, which asserts the first input of AND gate 110 once a subsequent rising edge of signal OSC-G occurs. The output of AND gate 110 then asserts to a logic high value until the next rising edge of signal OSC-G occurs, which causes the output of AND gate 110 to deassert to a logic low value. Thus, it is verified that signal START is asserted by AND gate 110 for each rising edge of signal CLK IN that occurs and that the pulse width of signal START is equal to one period of signal OSC-G. It is further verified that an additional flip-flop may be added to the input of flip-flops 106-108 to prevent meta-stability if desired.

The single pulse generated by AND gate 110 provides the start pulse, START, which begins DCC adaptation by asserting the clock enable input to N−1 bit register 112 at time 202. In response, the current value of N-bit counter 104, e.g., 15, is latched into N−1 bit register 112 at time 202. It is noted, however, that only N−1 bits are latched into N−1 bit register 112, where all but the most-significant-bit of the current binary count from N-bit counter 104 is latched into N−1 bit register 112. Thus, a logical shift-right operation is performed, which logically divides the count value, as provided by N-bit counter 104, by two prior to latching the divided count value into N−1 bit register 112.

Figure 2:
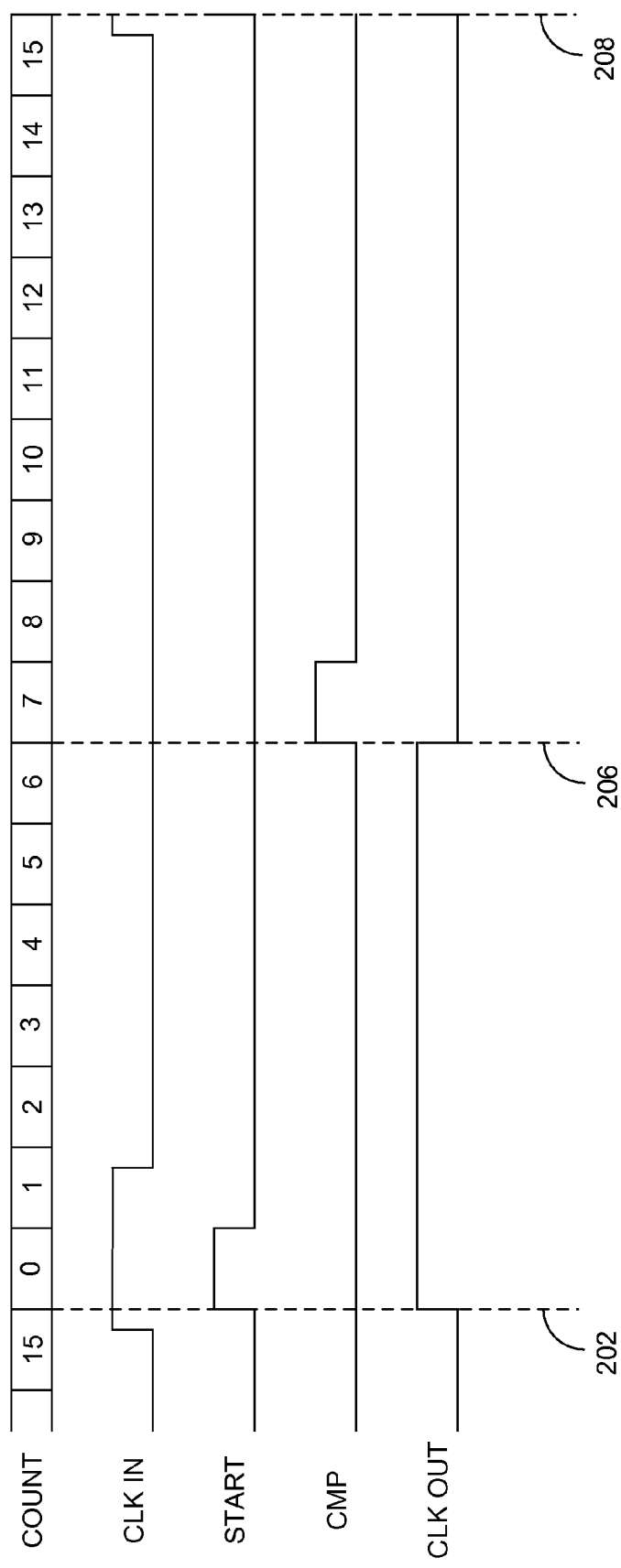
FIG. 2 illustrates a timing diagram of the exemplary operation of the DCC circuit of FIG. 1.

In one embodiment as exemplified in FIG. 2, a binary value of $111_b$ is latched into N−1 bit register 112, since $111_b$ represents the lower least-significant-bits of the binary count value of $1111_b$. That is to say, in other words, that the binary count value of $1111_b$ is logically shifted right by one bit position prior to being latched into N−1 bit register 112. All but the most-significant-bit of the current binary count from N-bit counter 104 is provided to comparator 114 as well, such that comparator 114 compares the divide-by-two count value, as latched into N−1 bit register 112, to the current divide-by-two count value, as generated by N-bit counter 104.

The count value latched into N−1 bit register 112 represents approximately one half of the total number of rising-edge occurrences of signal OSC-G that exist in one period of signal CLK IN. Since N-bit counter 104 continues to count rising-edge occurrences of signal OSC-G and since signal COUNT is reset by signal START, the divide-by-two count value generated by N-bit counter 104 eventually matches the divide-by-two count value that is latched into N−1 bit register 112. That is to say, in other words, that a match exists when the count value generated by N-bit counter 104 substantially equals the count value that is expected when an amount of time equal to one half of the period of signal CLK IN has transpired. Once a match occurs, the output of comparator 114 asserts to a logic high value, which deasserts signal CLK OUT to a logic low level at time 206.

It is noted in particular, that assertion of the logic output of comparator 114 resets signal CLK OUT to a logic low level so that a substantially 50% duty cycle of signal CLK OUT may be achieved between times 202 and 208. As exemplified in FIG. 2, it may be verified that the duty cycle of signal CLK OUT is equal to 7/16, or 43.75%, since signal CLK OUT is at a logic high value for 7 out of 16 counts of N-bit counter 104. Greater DCC accuracy may be achieved by increasing the frequency of signal OSC-G relative to the frequency of signal CLK IN as discussed above.

In an alternate embodiment, for example, the frequency of signal OSC-G may be increased to, e.g., 1000 times the frequency of signal CLK IN. In such an instance, a match occurs when the count value generated by N-bit counter 104 equals 499, which yields a duty cycle of signal CLK OUT of 499/1000, or 49.9%, since signal CLK OUT is at a logic high value for 499 out of 1000 counts of N-bit counter 104.

It can be seen that DCC circuit 100 of FIG. 1 continuously adapts duty cycle correction of signal CLK IN upon each occurrence of signal START through utilization of adaptation circuit 118, e.g., comparator 114 and flip-flop 116, as discussed above. That is to say, in other words, that DCC circuit 100 continuously updates the number of rising-edge occurrences of signal OSC-G that exist within a one-half period of signal CLK IN. As such, continuously updated duty cycle corrections occur for signal CLK OUT during each cycle of signal CLK IN as discussed above.

Figure 3:
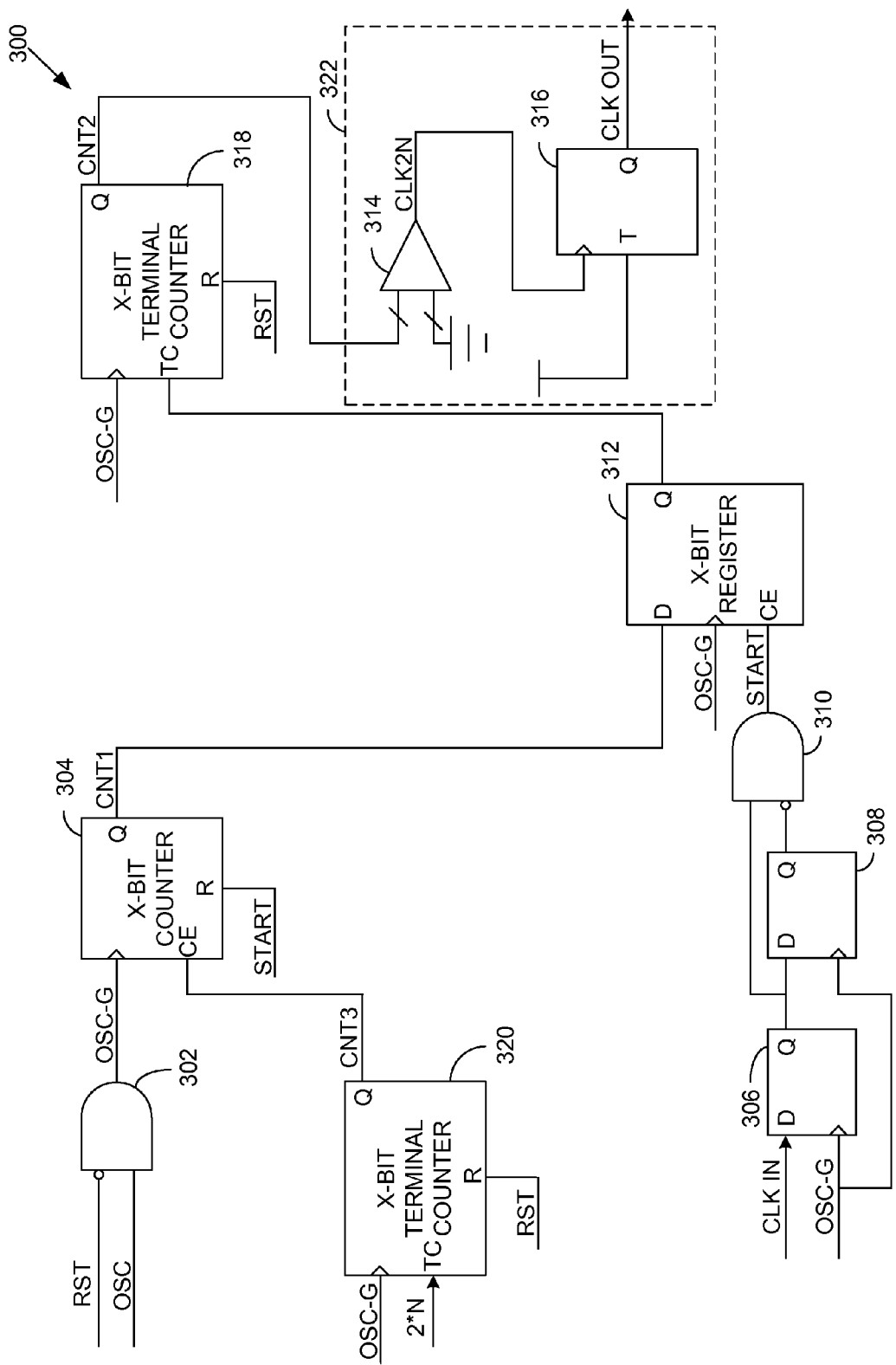
FIG. 3 illustrates a schematic diagram of a multiplication circuit in accordance with an alternate embodiment of the present invention.

Turning to FIG. 3, a schematic diagram of clock signal adaptation circuit 300 is exemplified, whereby in accordance with an alternate embodiment of the present invention, input clock signal characterization occurs during a first cycle of an input clock signal and clock signal adaptation, e.g., multiplication, of the input clock signal occurs during the subsequent cycle of the input clock signal. Thus, multiplication adaptation occurs for each cycle of the input clock signal based upon input clock signal characterization occurring during the immediately preceding input clock cycle.

In particular, a user-defined parameter, N, may be programmed as the multiplication factor that is used by multiplication circuit 300 to multiply the input signal, CLK IN, to generate an output signal, CLK OUT, having a frequency that is equal to $N^* f_{CLK\ IN}$, where $f_{CLK\ IN}$ is the frequency of the input signal, CLK IN. Similar to DCC circuit 100 of FIG. 1, multiplication circuit 300 also produces a duty cycle corrected version of the input signal CLK IN.

The clock signal to be adapted, CLK IN, is received by multiplication circuit 300 at the input of cascaded flip-flops 306 and 308. The output of flip-flop 308 is coupled to the inverting input of AND gate 310, while the output of flip-flop 306 is coupled to the non-inverting input of AND gate 310 and the D input of flip-flop 308. The output of AND gate 310 provides signal, START, which is the clock enable signal, CE, to X-bit register 312 and the reset signal to X-bit counter 304.

A free-running oscillator signal, OSC, is received by the non-inverting input of AND gate 302, while a reset signal, RST, is received by the inverting input of AND gate 302. The output of AND gate 302 provides a gated oscillator signal, OSC-G, to the clock input of X-bit counter 304. Gated oscillator signal OSC-G is also provided to the clock inputs of flip-flops 306, 308, X-bit counter 304, X-bit terminal counters 318-320, and X-bit register 312. The output of X-bit counter 304, CNT1, is provided to the D inputs of X-bit register 312. The output of X-bit register 312 is provided to the terminal count (TC) input of X-bit terminal counter 318. The output of X-bit terminal counter 318, CNT2, is provided to the first input of comparator 314, while the second input of comparator 314 is coupled to receive a logic low level, e.g., ground potential. The output of comparator 314 is coupled to the clock input of toggle flip-flop 316. The input of toggle flip-flop 316 is coupled to receive a logic high level, while the output of toggle flip-flop 316 provides the multiplied output, CLK OUT, from multiplier circuit 300.

In operation, the free-running oscillator signal, OSC-G, operates at a frequency that is much higher than the frequency of the signal that is to be adapted, i.e., CLK IN. Signal OSC-G may be generated by virtually any oscillating device, such as a ring oscillator, which may be readily instantiated within an integrated circuit, such as a PLD.

The relative frequency difference between signals OSC-G and CLK IN is used to determine the size, X, of counters 304, 318, 320 and register 312. If the frequency of signal OSC-G is much higher than the frequency of CLK IN, an increased counter width is required to prohibit counter overflow. For example, if the frequency of signal OSC-G is equal to 200 MHz and the frequency of signal CLK IN is equal to 1 KHz, then a, e.g., 18-bit counter, is sufficient to perform the calculations required for frequency multiplication. Conversely, if the frequency of signals OSC-G and CLK IN are relatively close in frequency, then a decreased counter width may be used while maintaining a low risk of counter overflow.

Several counter calculations are required in order to derive the multiplied clock signal, CLK OUT. First, the period of the input clock signal, CLK IN, is determined such that the number of OSC-G cycles that exist within one period of signal CLK IN is ascertained. Second, a pulse train having a frequency that is equal to 2*N is generated, which is not duty cycle corrected. Finally, a divide-by-two operation is performed on the 2*N pulse train in order to generate the duty-cycle-corrected signal having a frequency that is equal to $N*f_{CLK\ IN}$.

X-bit terminal counter 320 receives the programmable value of 2*N, such that the terminal count value of X-bit terminal counter 320 is programmed to be equal to 2*N−1. As such, X-bit terminal counter 320 repeatedly counts from 0 to the terminal count value of 2*N−1 during the operation of multiplier circuit 300.

Figure 4:
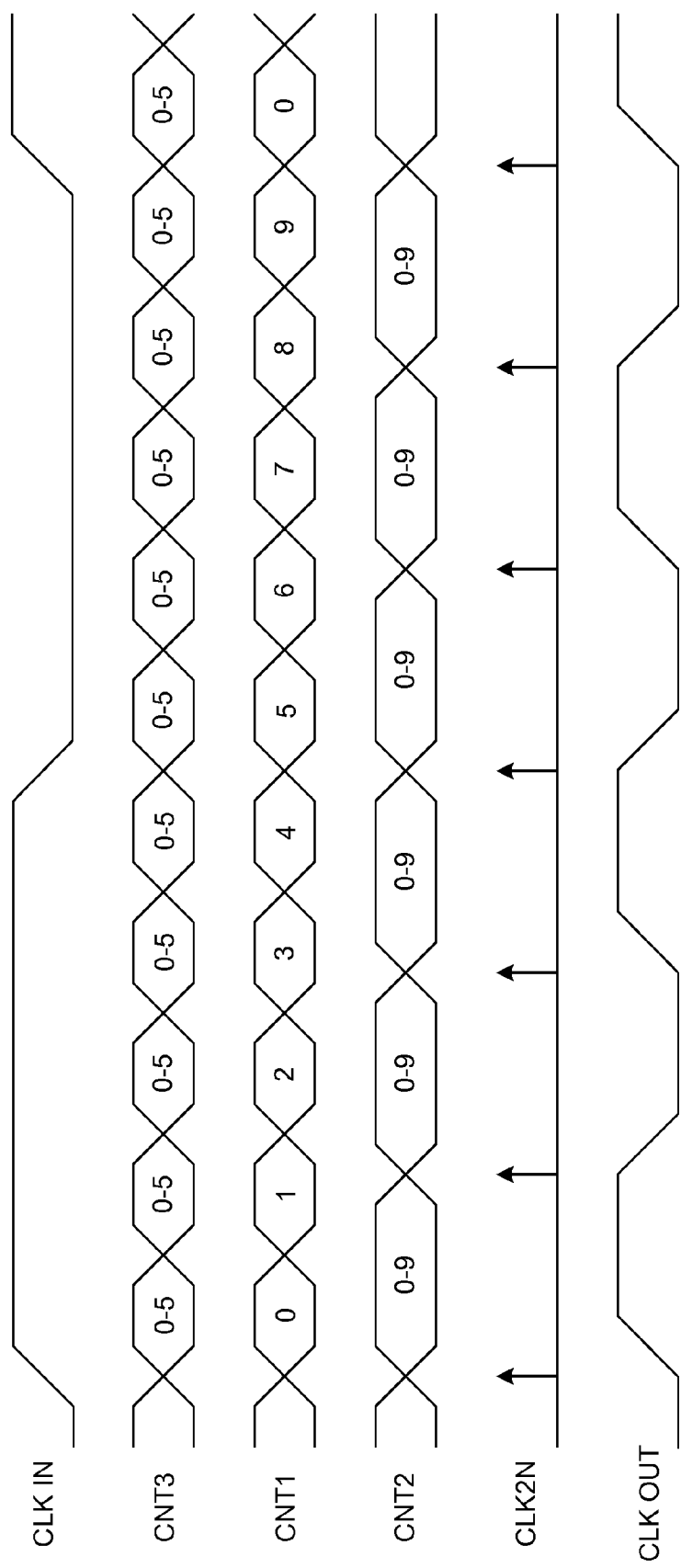
FIG. 4 illustrates a timing diagram of the exemplary operation of the multiplication circuit of FIG. 3.

Turning to FIG. 4, an exemplary timing diagram depicts the operation of multiplier circuit 300 when N is programmed to, e.g., a value of 3. In particular, the timing diagram of FIG. 4 illustrates, among other features, the tandem operation of X-bit terminal counter 320 and X-bit counter 304. On each rising, or falling, edge of signal OSC-G, which as discussed above is the gated version of signal OSC, the count value of X-bit terminal counter 320 is incremented. Once the terminal count of X-bit terminal counter 320 is reached, the count value of X-bit terminal counter 320 rolls back to zero, which asserts the Q output of X-bit terminal counter 320. In response, the count value of X-bit counter 304 increments by one. In such an instance, X-bit counter 304 operates to count the number of times that the count of X-bit terminal counter 320 rolls over during a single period of signal CLK IN.

As discussed above, flip-flops 306,308 and AND gate 310 interoperate as a rising edge detector, whereby a rising edge of signal CLK IN asserts the first input of AND gate 310 once a subsequent rising edge of signal OSC-G occurs. The output of AND gate 310 then asserts to a logic high value until the next rising edge of signal OSC-G occurs, which causes the output of AND gate 310 to deassert to a logic low value. Thus, it is verified that signal START is asserted by AND gate 310 for each rising edge of signal CLK IN that occurs and that the pulse width of signal START is equal to one period of signal OSC-G. It is further verified that an additional flip-flop may be added to the input of flip-flops 306-308 to prevent metastability if desired.

Thus, signal START marks the beginning of each CLK IN cycle and the combination of counters 320 and 304 perform the calculation of the number of OSC-G cycles that exist within each CLK IN cycle. In particular, the number of OSC-G cycles that exist within each CLK IN cycle is substantially equal to M*(2*N), where M is equal to the number of count increments of X-bit counter 304 that occur during each CLK IN cycle and 2*N is the number of count increments of X-bit terminal counter 320 that occur before X-bit terminal counter 320 rolls over. As depicted in the exemplary timing diagram of FIG. 4, the number of roll-over occurrences of X-bit terminal counter 320 that occur in a single period of signal CLK IN as counted by X-bit counter 304 is equal to, e.g., 10, which is then provided as the terminal count value of X-bit terminal counter 318.

Since the terminal count value of X-bit terminal counter 318 is programmed to be equal to the number of roll-over occurrences of X-bit terminal counter 320 during one period of signal CLK IN, then each roll-over occurrence of X-bit terminal counter 318 provides an indication, or watermark, of the number of OSC-G cycles that exist within a sub-period of signal CLK IN. That is to say, in other words, that the watermark provided by X-bit terminal counter 318 provides an indication of the number of OSC-G cycles that exist in every 1/(2*N) sub-period of signal CLK IN.

Thus, in the exemplary timing diagram of FIG. 4, X-bit terminal counter 318 provides an indication of the number of OSC-G cycles that exist in each $1/(2*N)=\frac{1}{6}^{th}$ sub-period of signal CLK IN. In particular, since the terminal count value of X-bit terminal counter 320 is programmed to, e.g., 6, and since the number of roll-over occurrences of X-bit counter 304 is equal to, e.g., 10, then the number of OSC-G cycles in one period of signal CLK IN is equal to 60. Furthermore, since the number of roll-over occurrences of X-bit terminal counter 318 during one period of signal CLK IN is equal to, e.g., 6, then the number of OSC-G cycles in each $\frac{1}{6}^{th}$ sub-period of signal CLK IN is equal to 60/6=10.

Comparator 314 of adaptation circuit 322 is then utilized to provide 2*N equally spaced pulses, i.e., watermarks, during one period of signal CLK IN by comparing the count value of X-bit terminal counter 318 to a logic low value. In other words, comparator 314 asserts a pulse each time the count value, CNT2, of X-bit terminal counter 318 rolls over to zero. It is noted that comparator 314 may also be implemented as a logic NOR function, since a logic high level is asserted at the output of the logic NOR function if all inputs are deasserted to a logic low level. As illustrated in the exemplary timing diagram of FIG. 4, comparator 314 asserts signal CLK2N having, e.g., 2*N=6, equally spaced pulses during a single period of signal CLK IN. Utilization of toggle flip-flop 316 divides signal CLK2N by two, which results in signal CLK OUT having a frequency that is N times the frequency of signal CLK IN and having a duty cycle that is substantially equal to 50% as illustrated in FIG. 4.

It is noted that multiplier circuit 300 continues to characterize the number of OSC-G cycles in each subsequent CLK IN cycle through utilization of the combined count values of counters 320 and 304 as discussed above. As such, the accuracy of multiplication provided by multiplier circuit 300 continues to be updated since the terminal count value of X-bit terminal counter 318 is continuously being updated by X-bit register 312 for each CLK IN cycle. Thus, variations in the frequency of signal CLK IN are tracked and updated at each cycle of signal CLK IN by the operation of multiplier circuit 300.

It is also noted that since toggle flip-flop 316 of adaptation circuit 322 divides signal CLK2N by two, signal CLK OUT may exhibit any frequency that is N times the frequency of signal CLK IN. That is to say, in other words, that any integer multiple, e.g., 1, 2, 3, etc., of the input clock signal, CLK IN, may be generated as the output clock signal, CLK OUT.

Figure 5:
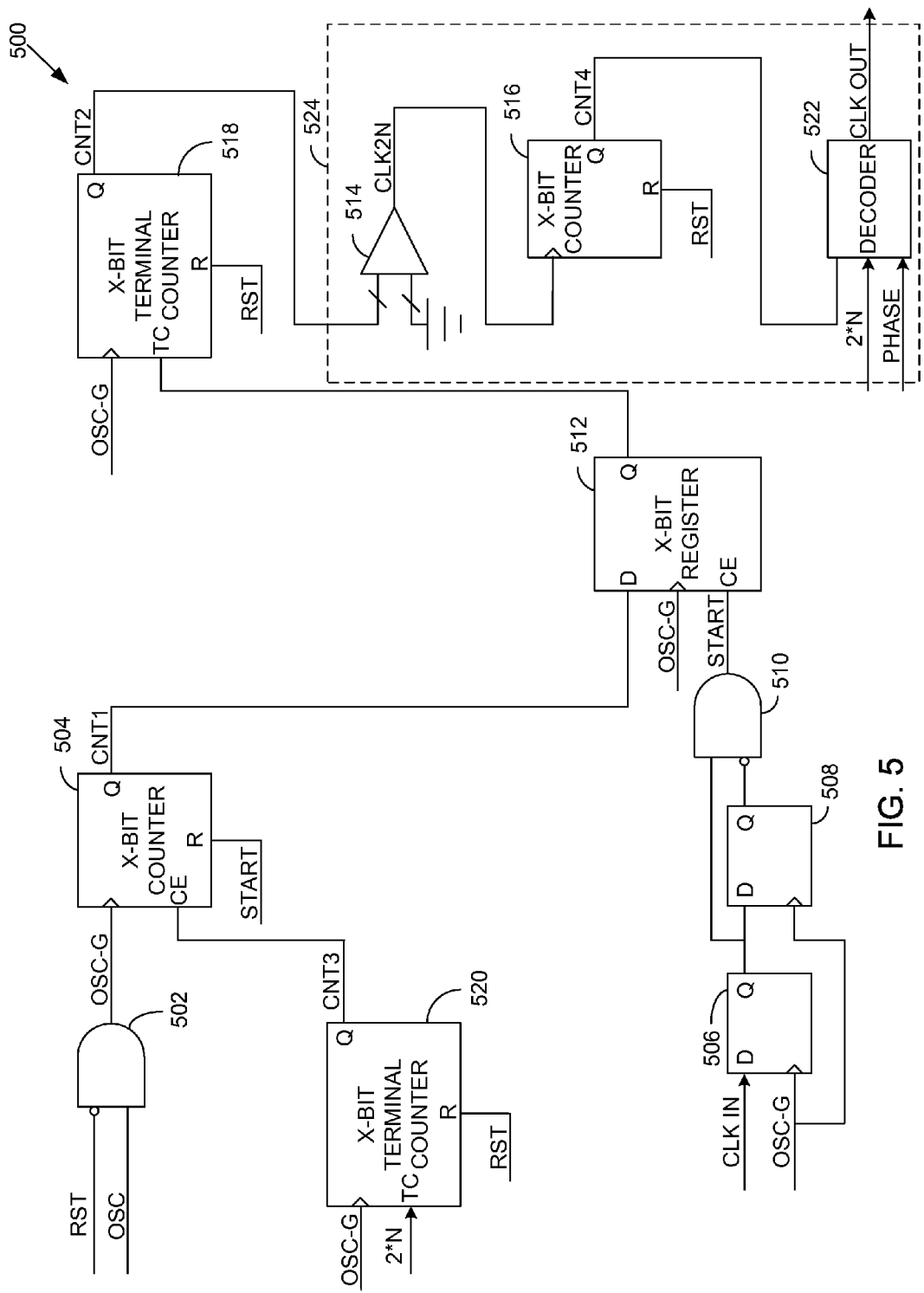
FIG. 5 illustrates a schematic diagram of a phase-shift circuit in accordance with an alternate embodiment of the present invention.

Turning to FIG. 5, a schematic diagram of clock signal adaptation circuit 500 is exemplified, whereby in accordance with an alternate embodiment of the present invention, input clock signal characterization occurs during a first cycle of an input clock signal and clock signal adaptation, e.g., phase shifting, of the input clock signal occurs during the subsequent cycle of the input clock signal. Phase-shift circuit 500 of FIG. 5 is substantially identical to multiplier circuit 300 of FIG. 3, except that toggle flip-flop 316 of FIG. 3 is replaced with X-bit counter 516 and decoder 522.

The operation of phase-shift circuit 500 is substantially the same as discussed above in relation to FIGS. 3 and 4, except that the output of comparator 514 is not divided by two. As discussed above in relation to FIG. 3, comparator 514 may also be implemented as a logic NOR function, since a logic high level is asserted at the output of the logic NOR function if all inputs are deasserted to a logic low level. X-bit counter 516 of adaptation circuit 524 is utilized to count the number of pulses generated by comparator 514 of adaptation circuit 524. The pulse count value, CNT4, is then provided to decoder 522 of adaptation circuit 524, which utilizes signal CNT4 in combination with programmable phase-shift variable, PHASE, to provide signal CLK OUT that exhibits the correct phase offset with respect to signal CLK IN.

In particular, decoder 522 receives the value, 2*N, that is also utilized to set the terminal count of X-bit terminal counter 520 as discussed above in relation to FIG. 3. As such, decoder 522 exploits the known relationship between signals CNT4 and CLK IN, i.e., signal CNT4 increments at a frequency that is equal to $2*N*f_{CLK\,IN}$. Thus, by monitoring the resetable count value of signal CNT4, decoder 522 may decode signal CNT4 to provide signal CLK OUT that conforms to the required phase shift as programmed by signal PHASE.

Figure 6:
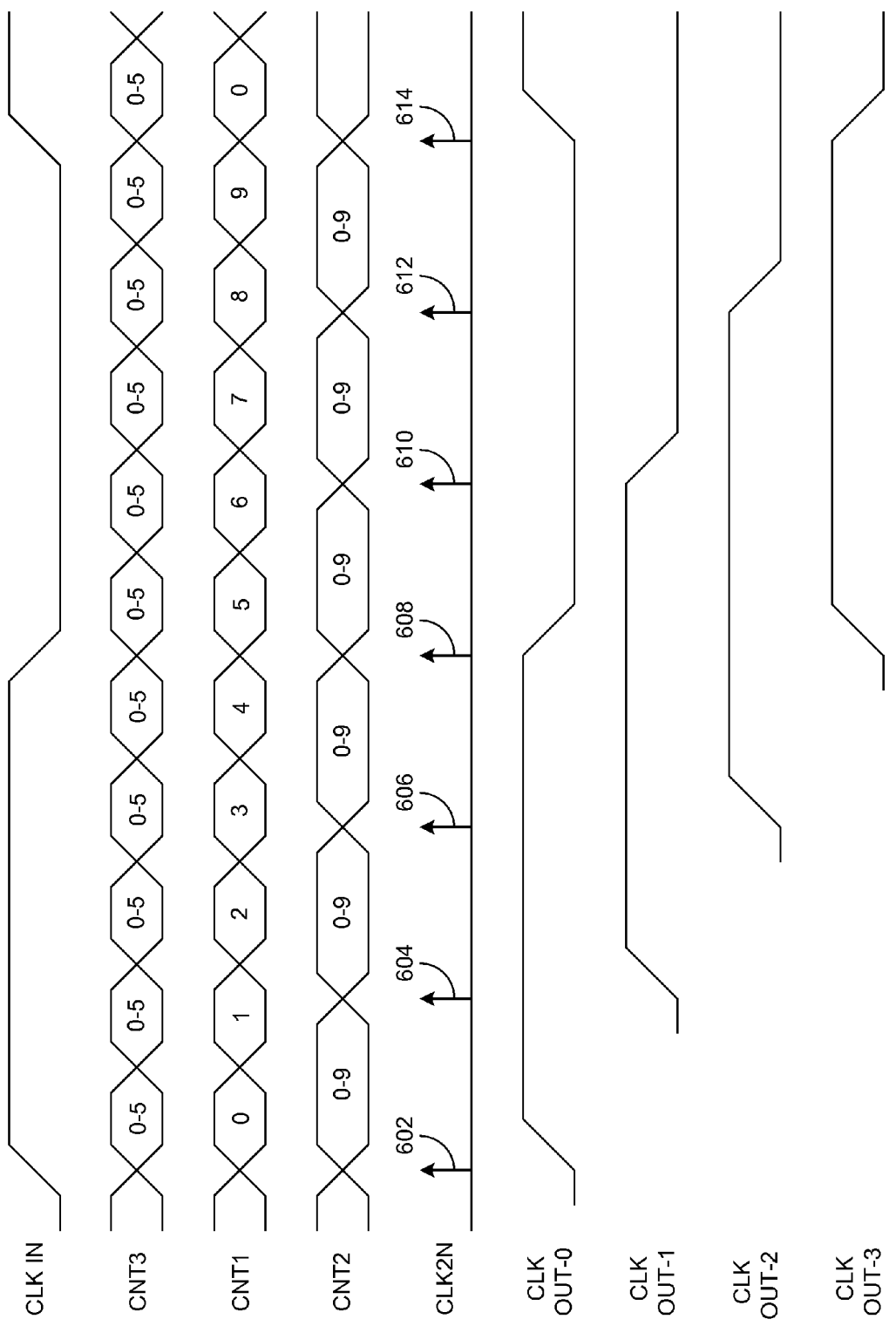
FIG. 6 illustrates a timing diagram of the exemplary operation of the phase-shift circuit of FIG. 5.

For example, if a zero phase shift is required, then upon the occurrence of a single increment of signal CNT4, e.g., in response to pulse 602, decoder 522 asserts signal CLK OUT-0. Decoder 522 then deasserts signal CLK OUT-0 after signal CNT4 is incremented N more times. In the exemplary embodiment of FIG. 6, for example, N is equal to, e.g., 3. Thus, signal CNT4 is incremented 3 more times in response to pulses 604-608, which causes decoder 522 to deassert signal CLK OUT-0 as illustrated. Decoder then reasserts signal CLK OUT-0 after signal CNT4 is incremented 3 more times in response to pulses 610-614.

In general, decoder 522 may phase-shift signal CLK OUT with respect to sub-periods, P, of signal CLK IN as watermarked by pulses 602-614. That is to say, in other words, that pulses 602-614 represent watermarks occurring at sub-period offsets that are phase aligned with signal CLK IN. Each sub-period offset is defined by equation (1):

$$OFFSET = P*PERIOD/(2*N), \quad (1)$$

where P is the number of sub-period offsets desired and PERIOD is the period of signal CLK IN.

If a single sub-period offset is desired, for example, then the value of P is set to 1, such that upon the occurrence of two increments of signal CNT4, e.g., in response to pulses 602 and 604, decoder 522 asserts signal CLK OUT-1. Decoder 522 then deasserts signal CLK OUT-1 after signal CNT4 is incremented N more times. In the exemplary embodiment of FIG. 6, for example, N is equal to, e.g., 3. Thus, signal CNT4 is incremented 3 more times in response to pulses 606-610, which causes decoder 522 to deassert signal CLK OUT-1 as illustrated. Similar phase-shift operation may be verified for signals CLK OUT-2 and CLK OUT-3 that exhibit 2-period and 3-period offsets, respectively, with respect to signal CLK IN.

It can be seen, therefore, that decoder 522 simply monitors the number of CNT4 increments and asserts/deasserts signal CLK OUT to implement the correct phase-shift, i.e., OFFSET, in accordance with the known relationship between signals N, PHASE, P, and PERIOD. By increasing the programmable value of N, the resolution of phase-shift offsets may also be increased. For example, if the value of N is increased to, e.g., 50, then the terminal count of X-bit terminal counter 520 is equal to 100. Accordingly, the number of CLK2N pulses that exist within a single period of signal CLK IN is equal to 100. As such, the phase-shift granularity that may be implemented by decoder 522 is equal to 1%, whereby the phase of signal CLK OUT may be shifted in 1% increments with respect to the phase of signal CLK IN. It can be seen, therefore, that virtually any percentage phase shift may be accommodated, simply by increasing the value of N accordingly.

Figure 7:
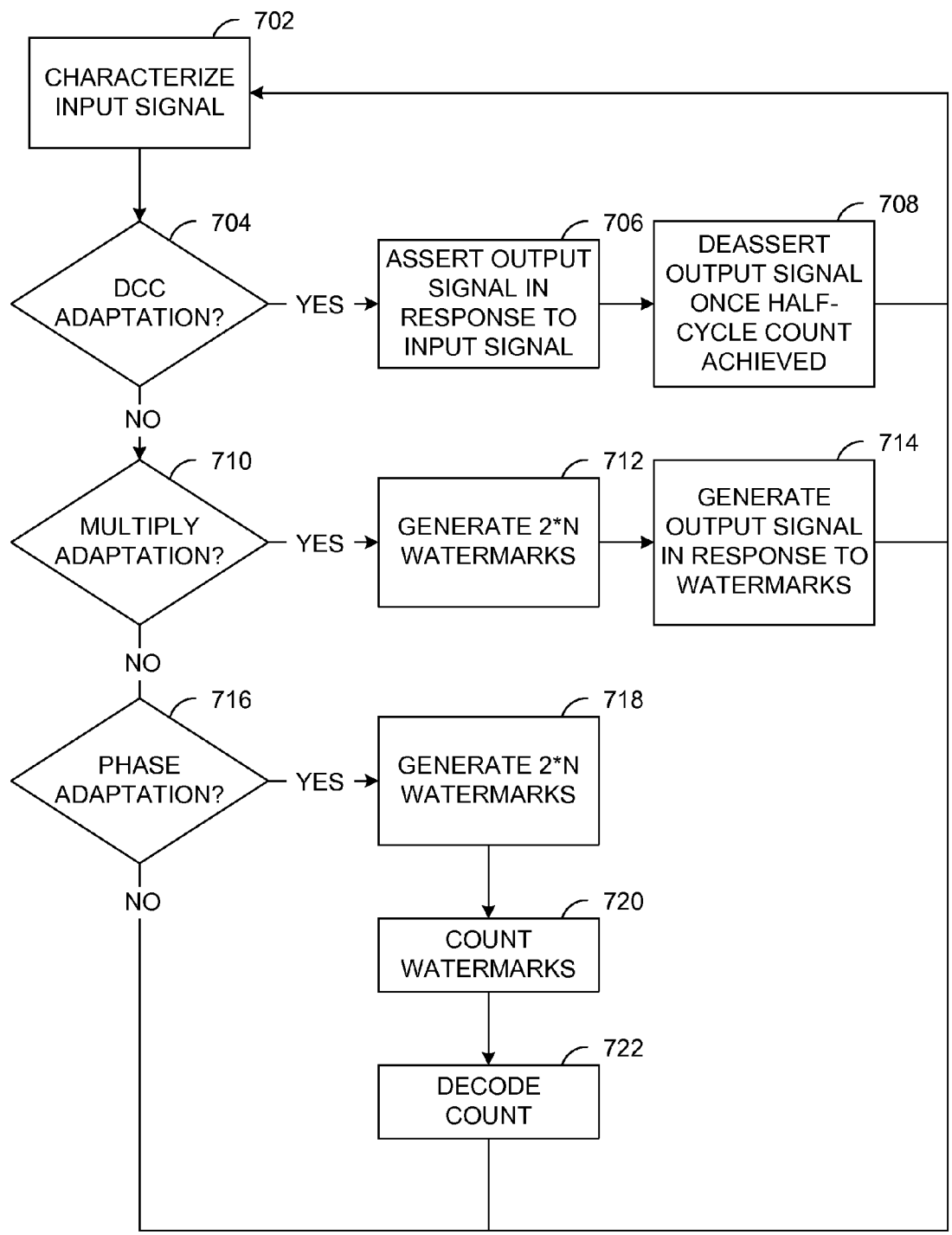
FIG. 7 illustrates a flow diagram of methods of implementing counter-based clock signal adaptation in accordance with various embodiments of the present invention.

Turning to FIG. 7, a flow diagram of a method of implementing counter-based clock signal adaptation is exemplified. In step 702, characterization of the input signal occurs, whereby a number of free-running oscillator cycles is determined to exist within a single period of the input signal. Input signal adaptation may then be implemented during the subsequent period of the input signal as determined by adaptation mode determination steps 704, 710, or 716.

In step 704, for example, DCC adaptation may be implemented as discussed above in relation to FIGS. 1 and 2. In particular, step 706 asserts signal CLK OUT in response to the assertion of signal START, which also begins a subsequent count of the number of free-running oscillator cycles that exist within a subsequent period of the input signal. Once the subsequent count reaches a count value that is expected when an amount of time equal to one half of the period of signal CLK IN has transpired, then signal CLK OUT is deasserted in step 708, which generates a duty cycle for signal CLK OUT that is substantially equal to 50%.

Characterization of the input signal is then repeated as in step 702 to once again count the number of free-running oscillator cycles that exist within a subsequent period of the input signal. In this way, DCC is continuously adapted at each clock cycle of the input signal in response to cycle variations that may occur within the input signal being characterized.

In step 710, multiplication adaptation of the input signal may be implemented instead. In particular, watermarks are generated at a frequency that is equal to twice the requested multiplication factor, N. That is to say, in other words, that watermarks having a frequency equal to $2*N*f_{CLK\,IN}$ are generated in step 712 as discussed above in relation to FIGS. 3 and 4. The watermarks are then used as the clock signal input to a toggle flip-flop, which provides the output signal in step 714 having a frequency that is one half of the frequency of the watermarks, i.e., $N*f_{CLK\,IN}$, which is a frequency that is equal to the requested multiplication factor. In addition, step 714 also corrects the duty cycle of the frequency divided watermarks to be substantially equal to 50%.

Characterization of the input signal is then repeated as in step 702 to once again count the number of free-running oscillator cycles that exist within a subsequent period of the input signal. In this way, multiplication of the input signal is continuously adapted at each clock cycle of the input signal in response to frequency variations that may occur within the input signal being characterized.

In step 716, on the other hand, phase-shift adaptation of the input signal may instead be implemented. Step 718 substantially operates as discussed above in relation to step 712 to produce watermarks that exhibit a frequency equal to $2*N*f_{CLK\ IN}$. The watermarks, however, are counted in step 720 and then decoded in step 722 to generate an output signal that exhibits the correct phase-shift.

As discussed above in relation to FIGS. 5 and 6, for example, decoder 522 phase-shifts signal CLK OUT with respect to sub-periods, P, of signal CLK IN that are represented by the watermarks generated in step 718. In particular, decoder 522 simply monitors the number of counter increments that are caused by the watermarks in step 720 to implement the correct phase-shift in step 722. By increasing the number of watermarks generated, the resolution of phase-shift offsets may also be increased.

Characterization of the input signal is then repeated as in step 702 to once again count the number of free-running oscillator cycles that exist within a subsequent period of the input signal. In this way, phase shifting of the input signal is continuously adapted at each clock cycle of the input signal in response to cycle variations that may occur within the input signal being characterized.

Generally, the various embodiments presented herein provide methods and apparatus that are adapted to modify an input clock signal to provide duty cycle correction, multiplication, and phase-shift adaptation of the input clock signal. Furthermore, updates to the clock signal adaptation occur for each clock cycle of the input clock signal, which offers significant advantages over phase locked loop and delay locked loop circuits that require many periods of the input clock signal to transpire before clock signal adaptation may occur.

Other aspects and embodiments of the present invention will be apparent to those skilled in the art from consideration of the specification and practice of the invention disclosed herein. For example, it can be seen that the phase-shift circuit of FIG. 6 may be adapted to implement duty cycle correction of signal CLK IN as an alternate embodiment of DCC circuit 100 as discussed above in relation to FIG. 1. It is intended that the specification and illustrated embodiments be considered as examples only, with a true scope and spirit of the invention being indicated by the following claims.

What is claimed is:

1. A method of implementing counter-based signal adaptation, the method comprising:
   generating an oscillator signal;
   characterizing an input signal, wherein the characterization includes counting a number of cycles of the oscillator signal that exist within a first period of the input signal; and
   adapting the input signal during a second period of the input signal in response to the number of cycles counted to provide an output signal, wherein the second period of the input signal is the next period after the first period of the input signal.

2. The method of claim 1, wherein characterizing the input signal further includes:
   detecting a first transition of a logic state of the input signal to begin a first count during the first period; and
   detecting a second transition of the logic state of the input signal to end the first count and to begin a second count during the second period.

3. The method of claim 2, wherein adapting the input signal comprises correcting a duty cycle of the input signal.

4. The method of claim 3, wherein correcting the duty cycle of the input signal comprises:
   asserting a logic state of the output signal in response to the detected second transition of the logic state of the input signal; and
   deasserting the logic state of the output signal when the second count substantially equals half of the first count.

5. The method of claim 2, wherein adapting the input signal comprises multiplying a frequency of the input signal by an integer value to produce a target frequency of the output signal that is substantially equal to the product of the integer value and the frequency of the input signal.

6. The method of claim 5, wherein multiplying the frequency of the input signal comprises:
   generating pulses at a frequency that is substantially equal to twice the target frequency; and
   dividing the frequency of the generated pulses by two to produce the output signal.

7. The method of claim 2, wherein adapting the input signal comprises shifting a phase of the input signal to produce the output signal having a phase that is offset from the phase of the input signal by a programmable amount.

8. The method of claim 7, wherein shifting the phase of the input signal comprises:
   generating pulses at a frequency that is substantially equal to an integer multiple of a frequency of the input signal;
   counting the number of pulses generated; and
   decoding the count of the number of pulses generated to produce the output signal.

9. A signal adaptation circuit, comprising:
   an edge detector coupled to receive an input signal and adapted to assert a start signal in response to detecting logic transitions of the input signal, the start signal assertions being indicative of the beginning of each cycle of the input signal;
   a counter circuit coupled to receive an oscillator signal and the start signal, the counter circuit being adapted to provide a count signal, the count signal being indicative of a number of cycles of the oscillator signal contained within a first period of the input signal; and
   an adaptation circuit coupled to the counter circuit, the adaptation circuit being adapted to generate an output signal during the next period after the first period of the input signal, wherein characteristics of the output signal are adapted in response to the number of cycles of the oscillator signal contained within a first period of the input signal.

10. The signal adaptation circuit of claim 9, wherein the edge detector comprises:
    a first flip-flop having a first input coupled to receive the input signal and a second input coupled to receive the oscillator signal;
    a second flip-flop having a first input coupled to an output of the first flip-flop at a first node and a second input coupled to receive the oscillator signal; and
    a logic gate having a first input coupled to the first node, a second input coupled to an output of the second flip-flop, and an output coupled to provide the start signal.

11. The signal adaptation circuit of claim 10, wherein the counter circuit comprises:

a counter having an input coupled to receive the oscillator signal and an output coupled to provide the count signal, the count signal including a binary combination of data bits; and a register having a first input coupled to receive the count signal, a second input coupled to receive the start signal, and an output coupled to provide a stored representation of the count signal in response to the start signal, wherein the count signal stored by the register excludes the most-significant-bit of the count signal.

12. The signal adaptation circuit of claim 11, wherein the adaptation circuit comprises:

a logic gate having a first input coupled to receive the count signal and a second input coupled to receive the stored representation of the count signal, wherein the count signal received by the logic gate excludes the most-significant-bit of the count signal; and a third flip-flop having a first input coupled to receive a logic value, a reset input coupled to an output of the logic gate, and an output coupled to provide the output signal exhibiting a corrected duty cycle relative to a duty cycle of the input signal, wherein the corrected duty cycle is substantially equal to fifty percent.

13. The signal adaptation circuit of claim 10, wherein the counter circuit comprises:

a first counter having a first input coupled to receive the oscillator signal, a second input coupled to receive a first terminal count value, and an output coupled to provide a first count signal, the first count signal being asserted when a count value of the first counter equals the first terminal count value;

a second counter having a first input coupled to receive the oscillator signal, a second input coupled to receive the first count signal, and an output coupled to provide a second count signal, the second count signal including a binary combination of data bits indicative of a number of assertions of the first count signal contained within a first period of the input signal;

a register having a first input coupled to receive the second count signal, a second input coupled to receive the start signal, and an output coupled to provide a stored representation of the second count signal; and a third counter having a first input coupled to receive the oscillator signal, a second input coupled to receive the stored representation of the second count signal, and an output coupled to provide a third count signal, the third count signal including a binary combination of data bits indicative of a number of cycles of the oscillator signal contained within a portion of the first period of the input signal.

14. The signal adaptation circuit of claim 13, wherein the adaptation circuit comprises:

a logic gate having a first input coupled to receive the third count signal and a second input coupled to receive a first logic value; and a third flip-flop having a first input coupled to receive a second logic value, a second input coupled to an output of the logic gate, and an output coupled to provide the output signal exhibiting a frequency that is an integer multiple of a frequency of the input signal.

15. The signal adaptation circuit of claim 13, wherein the adaptation circuit comprises:

a logic gate having a first input coupled to receive the third count signal and a second input coupled to receive a logic value;

a fourth counter having an input coupled to an output of the logic gate and an output coupled to provide a fourth count signal; and a decoder having an input coupled to receive the fourth count signal and an output coupled to provide the output signal exhibiting a phase offset relative to a phase of the input signal.

16. A method of adapting an input signal, comprising:

characterizing the input signal during a first period of the input signal;

determining an adaptation mode to be applied by an adaptation circuit; and applying the determined adaptation in response to the characterization to produce an output signal, the determined adaptation being applied during a second period of the input signal, wherein the second period is the next period after the first period.

17. The method of claim 16, wherein characterizing the input signal comprises determining a first count of oscillator cycles that exist within the first period of the input signal.

18. The method of claim 17, wherein applying the determined adaptation comprises:

asserting a logic level of the output signal in response to an assertion of a logic level of the input signal;

monitoring a second count of oscillator cycles during the second period of the input signal; and deasserting the logic level of the output signal in response to the second count obtaining substantially half the magnitude of the first count.

19. The method of claim 17, wherein applying the determined adaptation comprises:

selecting a multiplication factor to be implemented by the adaptation circuit;

generating pulses having a frequency that is equal to twice the product of a frequency of the input signal and the multiplication factor, the frequency of the generated pulses being derived from the first count; and dividing the frequency of the generated pulses by two.

20. The method of claim 17, wherein applying the determined adaptation comprises:

selecting a phase shift to be implemented by the adaptation circuit;

generating pulses having a frequency that is equal to twice the product of a frequency of the input signal and a multiplication factor, the frequency of the generated pulses being derived from the first count;

asserting a logic level of the output signal in response to a first count of generated pulses; and deasserting the logic level of the output signal in response to a second count of generated pulses.

* * * * *